(12) United States Patent
Korada et al.

(10) Patent No.: US 11,354,700 B2
(45) Date of Patent: *Jun. 7, 2022

(54) ADAPTIVE LEAD GENERATION FOR MARKETING

(71) Applicant: Zeta Global Corp., New York, NY (US)

(72) Inventors: Pavan Korada, San Mateo, CA (US); Sunpreet Singh Khanuja, Santa Clara, CA (US); Weiwei Zhang, Palo Alto, CA (US); Bharat Goyal, San Jose, CA (US)

(73) Assignee: Zeta Global Corp., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,471

(22) Filed: Jun. 26, 2019

(65) Prior Publication Data

US 2019/0318378 A1 Oct. 17, 2019

Related U.S. Application Data

(62) Division of application No. 15/594,104, filed on May 12, 2017, now Pat. No. 11,144,949.

(Continued)

(51) Int. Cl.
*G06Q 30/02* (2012.01)
*G06F 16/9535* (2019.01)
(Continued)

(52) U.S. Cl.
CPC ... *G06Q 30/0243* (2013.01); *G06F 16/24578* (2019.01); *G06F 16/9535* (2019.01);
(Continued)

(58) Field of Classification Search
CPC ............ G06Q 30/0243; G06Q 30/016; G06Q 30/0251; G06F 16/9535; G06F 16/24578; G06F 30/20
(Continued)

(56) References Cited

U.S. PATENT DOCUMENTS

| 6,792,399 B1 | 9/2004 | Phillips et al. |
| 7,003,476 B1 | 2/2006 | Samra et al. |

(Continued)

OTHER PUBLICATIONS

Promoting target models by potential measures (Year: 2010).*

(Continued)

*Primary Examiner* — Gautam Ubale
(74) *Attorney, Agent, or Firm* — Schwegman Lundberg & Woessner, P.A.

(57) ABSTRACT

Various examples are directed to systems and methods for adaptively generating leads. A marketing system may determine that a first lead score for a first lead is greater than a first lead score threshold and determine that a second lead score for a second lead is less than the first lead score threshold. The marketing system may generate a set of filtered leads including the first lead information from the first lead. The marketing system may determine a scrub rate that describes a portion of first execution cycle data having lead scores greater than the first lead score threshold and determine that the scrub rate is greater than an analysis window scrub rate by more than a scrub rate threshold. The marketing system may select a second lead score threshold that is lower than the first lead score threshold.

18 Claims, 8 Drawing Sheets

Related U.S. Application Data

(60) Provisional application No. 62/336,514, filed on May 13, 2016.

(51) Int. Cl.
*G06F 16/2457* (2019.01)
*G06F 30/20* (2020.01)
*G06Q 30/00* (2012.01)

(52) U.S. Cl.
CPC ........... *G06F 30/20* (2020.01); *G06Q 30/016* (2013.01); *G06Q 30/0251* (2013.01)

(58) Field of Classification Search
USPC .......................................... 705/319, 6, 14.42
See application file for complete search history.

(56) References Cited

U.S. PATENT DOCUMENTS

| | | | |
|---|---|---|---|
| 8,271,313 | B2 | 9/2012 | Williams et al. |
| 8,577,736 | B2 | 11/2013 | Swinson et al. |
| 10,157,352 | B1 | 12/2018 | Chan et al. |
| 10,242,068 | B1 | 3/2019 | Ross et al. |
| 10,387,833 | B2 | 8/2019 | Swinson et al. |
| 10,395,217 | B1 | 8/2019 | Lovejoy |
| 11,144,949 | B2 | 10/2021 | Korada et al. |
| 2004/0103017 | A1 | 5/2004 | Reed et al. |
| 2006/0242000 | A1 | 10/2006 | Giguiere |
| 2007/0219848 | A1* | 9/2007 | Hubsher ............ G06Q 30/0203 705/7.32 |
| 2007/0233561 | A1* | 10/2007 | Golec .................... G06Q 30/02 705/39 |
| 2007/0244741 | A1 | 10/2007 | Blume et al. |
| 2008/0288361 | A1* | 11/2008 | Rego ................. G06Q 30/0609 705/26.3 |
| 2009/0048859 | A1 | 2/2009 | Mccarthy et al. |
| 2011/0231230 | A1* | 9/2011 | Christon ................ G06Q 30/02 705/7.42 |
| 2011/0258016 | A1* | 10/2011 | Barak ..................... H04L 67/10 705/7.29 |
| 2011/0258049 | A1 | 10/2011 | Ramer et al. |
| 2011/0264479 | A1* | 10/2011 | Birr ........................ G06Q 30/02 705/7.13 |
| 2011/0276507 | A1 | 11/2011 | O'malley |
| 2011/0307382 | A1 | 12/2011 | Siegel |
| 2012/0323695 | A1 | 12/2012 | Stibel |
| 2013/0066676 | A1 | 3/2013 | Williams et al. |
| 2014/0046880 | A1 | 2/2014 | Breckenridge et al. |
| 2014/0149161 | A1 | 5/2014 | Hedges et al. |
| 2014/0149178 | A1 | 5/2014 | Hedges |
| 2014/0214482 | A1 | 7/2014 | Williams et al. |
| 2014/0236708 | A1 | 8/2014 | Wolff et al. |
| 2014/0249873 | A1* | 9/2014 | Stephan ............... G06Q 10/063 705/7.11 |
| 2014/0316883 | A1 | 10/2014 | Kitts et al. |
| 2015/0142713 | A1 | 5/2015 | Gopinathan et al. |
| 2015/0213503 | A1 | 7/2015 | Friberg, Jr. |
| 2015/0248693 | A1 | 9/2015 | Dubey |
| 2015/0379647 | A1 | 12/2015 | Gupta et al. |
| 2016/0071117 | A1 | 3/2016 | Duncan |
| 2016/0210657 | A1 | 7/2016 | Chittilappilly et al. |
| 2016/0217476 | A1* | 7/2016 | Duggal .............. G06Q 30/0201 |
| 2017/0206571 | A1 | 7/2017 | Dhawan et al. |
| 2017/0300933 | A1 | 10/2017 | Mascaro et al. |
| 2017/0329881 | A1 | 11/2017 | Korada et al. |
| 2017/0330220 | A1 | 11/2017 | Korada et al. |
| 2017/0345054 | A1 | 11/2017 | Sinha et al. |
| 2018/0060744 | A1 | 3/2018 | Achin et al. |
| 2019/0251593 | A1 | 8/2019 | Allouche |

OTHER PUBLICATIONS

Sales pipeline win propensity prediction: A regression approach (Year: 2015).*
Mining company networks for marketing insights and sales leads (Year: 2013).*
Automatic_Sales_Lead_Generation_from_Web_Data (Year: 2006).*
"U.S. Appl. No. 15/594,104, Non Final Office Action dated Sep. 30, 2019", 26 pgs.
"U.S. Appl. No. 15/594,104, Response filed Jun. 26, 2019 to Restriction Requirement dated May 23, 2019", 6 pgs.
"U.S. Appl. No. 15/594,104, Restriction Requirement dated May 23, 2019", 7 pgs.
"U.S. Appl. No. 15/594,104, Final Office Action dated Jan. 2, 2020", 31 pgs.
"U.S. Appl. No. 15/594,104, Response filed Nov. 19, 2019 to Non-Final Office Action dated Sep. 30, 2019", 15 pgs.
"U.S. Appl. No. 15/594,284, Non Final Office Action dated Jan. 16, 2020", 12 pgs.
U.S. Appl. No. 15/594,104, filed May 12, 2017, Adapative Lead Generation for Marketing.
U.S. Appl. No. 15/594,284, filed May 12, 2017, Adaptive Real Time Modeling and Scoring.
U.S. Appl. No. 17/450,490, filed Oct. 11, 2021, Adaptive Lead Generation for Marketing.
U.S. Appl. No. 17/538,647, filed Nov. 30, 2021, Adaptive Real Time Modeling and Scoring.
"U.S. Appl. No. 15/594,104, Advisory Action dated Mar. 9, 2020", 5 pgs.
"U.S. Appl. No. 15/594,104, Final Office Action dated Oct. 26, 2020", 31 pgs.
"U.S. Appl. No. 15/594,104, Non Final Office Action dated Jun. 24, 2020", 32 pgs.
"U.S. Appl. No. 15/594,104, Notice of Allowance dated Jun. 10, 2021", 23 pgs.
"U.S. Appl. No. 15/594,104, Response filed Jan. 26, 2021 to Final Office Action dated Oct. 26, 2020", 13 pgs.
"U.S. Appl. No. 15/594,104, Response filed Feb. 27, 2020 to Final Office Action dated Jan. 2, 2020", 11 pgs.
"U.S. Appl. No. 15/594,104, Response filed Jun. 2, 2020 to Final Office Action dated Jan. 2, 2020", 12 pgs.
"U.S. Appl. No. 15/594,104, Response Filed Sep. 24, 2020 to Non Final Office Action dated Jun. 24, 2020", 13 pgs.
"U.S. Appl. No. 15/594,284, Corrected Notice of Allowability dated Nov. 3, 2021", 9 pgs.
"U.S. Appl. No. 15/594,284, Final Office Action dated May 24, 2021", 12 pgs.
"U.S. Appl. No. 15/594,284, Final Office Action dated Aug. 4, 2020", 11 pgs.
"U.S. Appl. No. 15/594,284, Non Final Office Action dated Dec. 31, 2020", 12 pgs.
"U.S. Appl. No. 15/594,284, Notice of Allowance dated Oct. 27, 2021", 13 pgs.
"U.S. Appl. No. 15/594,284, Response filed Mar. 31, 2021 to Non Final Office Action dated Dec. 31, 2020", 7 pgs.
"U.S. Appl. No. 15/594,284, Response filed Apr. 16, 2020 to Non Final Office Action dated Jan. 16, 2020", 9 pgs.
"U.S. Appl. No. 15/594,284, Response filed Sep. 22, 2021 to Final Office Action dated May 24, 2021", 8 pgs.
"U.S. Appl. No. 15/594,284, Response filed Dec. 4, 2020 to Final Office Action dated Aug. 4, 2020", 8 pgs.

* cited by examiner

ADAPTIVE LEAD GENERATION FOR MARKETING

CLAIM OF PRIORITY

This patent application is a division of U.S. patent application Ser. No. 15/594,104, filed on May 12, 2017, which application claims the benefit of priority, under 35 U.S.C. Section 119(e) to U.S. Provisional Patent Application Ser. No. 62/336,514, filed on May 13, 2016, which are hereby incorporated by reference herein in their entireties.

TECHNICAL FIELD

Examples described herein generally relate to systems and methods for accurately and efficiently generating marketing leads.

BACKGROUND

Computer technology is used to generate marketing leads for companies that provide goods and/or services for sale.

BRIEF DESCRIPTION OF THE DRAWINGS

In the drawings, which are not necessarily drawn to scale, like numerals may describe similar components in different views. Like numerals having different letter suffixes may represent different instances of similar components. Some examples are illustrated by way of example, and not limitation, in the figures of the accompanying drawings in which.

DETAILED DESCRIPTION

Figure 1:
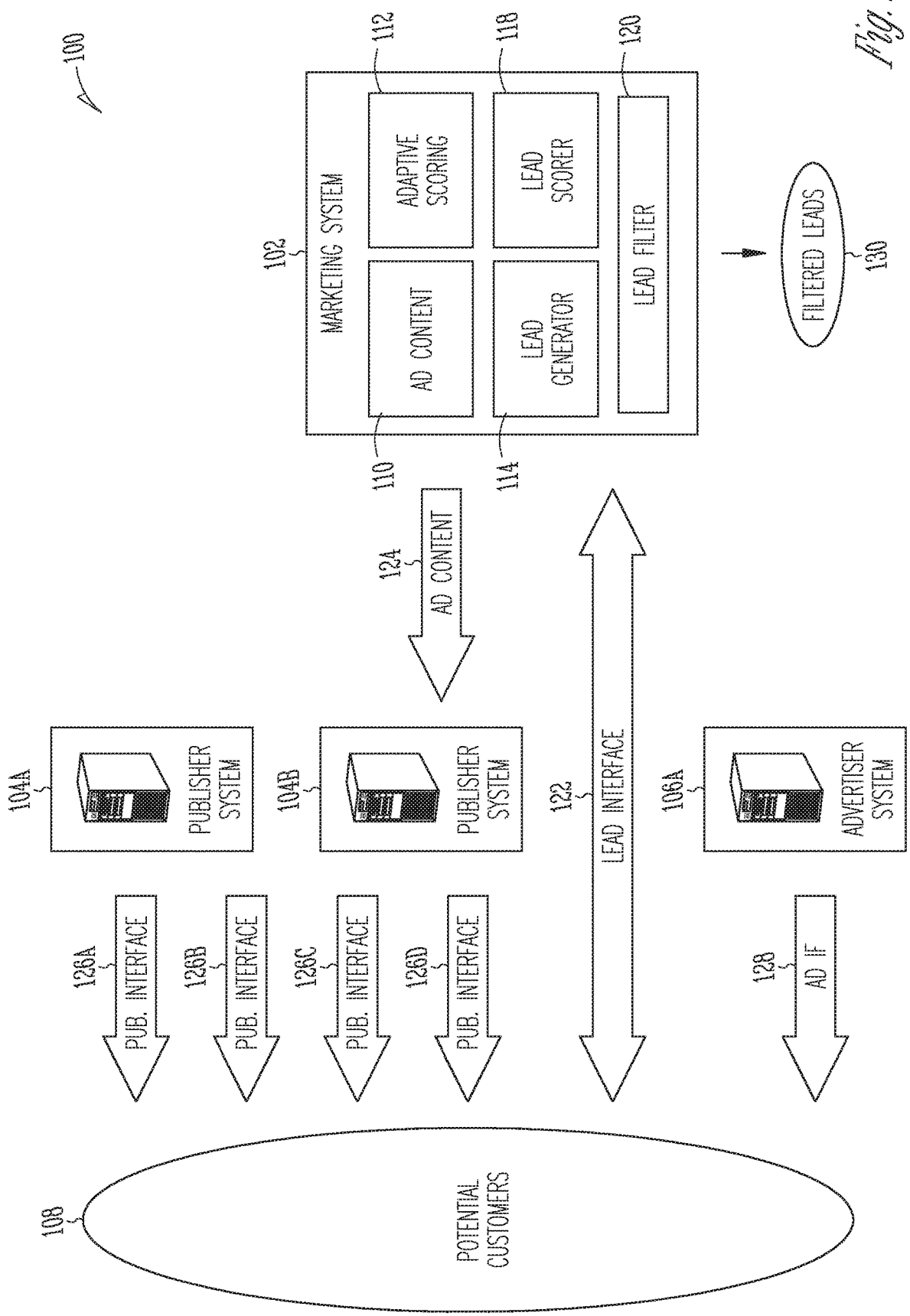
FIG. 1 is a diagram showing one example of an environment for adaptive lead generation.

In the following description, for purposes of explanation, numerous specific details are set forth in order to provide a thorough understanding of some examples. It will be evident, however, to one skilled in the art that the present disclosure may be practiced without these specific details.

Various examples are directed to systems and methods for adaptive lead generation. A lead includes data describing a potential customer for a good and/or service. Leads may be used to direct targeted advertising. For example, an advertiser may send advertising communications to a potential customer that are more extensive, personalized, and/or expensive that what the advertiser would send to the general public. A lead may convert if the potential customer described by a lead purchases a product or service from the advertiser or performs an action desired by the advertiser. For example, a lead may be considered to convert if the potential customer fills out a survey or performs another similar action requested by the advertiser.

A computerized marketing system is programmed to generate and filter leads. The marketing system may generate leads from various different sources. For example, the marketing system, or other suitable system, may provide advertising content to one or more publishers. Publishers distribute content to the public, for example, via the Internet. A publisher incorporates ad content into the content that it provides to the public. The advertising content may include a hyperlink or other link that is selectable by a potential customer to access a lead generator interface provided by the marketing system.

Through the lead generator interface, the marketing system may prompt the potential customer to provide information about him or herself, referred to as lead information. Lead information may include information such as the potential customer's name, age, geographic location, etc. In some examples, lead information also includes information relevant to the advertised goods and/or service. For example, if the advertiser is an educational institution, the lead generation interface may prompt the potential customer to provide data such as, age, highest level of education achieved, how soon the potential customer intends to begin schooling, etc. In another example, if the advertiser sells home security systems, the lead generation interface may prompt the potential customer to provide data such as, whether the potential customer owns or rents a house, whether the potential customer has experienced a break-in, etc. The marketing system may receive information from the potential customer and format the information into a lead.

The marketing system is also programmed to filter leads. For example, some leads are more likely to convert than others. The marketing system may train a model to correlate lead information to the likelihood that a lead will convert. Any suitable model may be used. The marketing system may utilize the model to provide a lead score to the leads, where the lead score for a lead is a value indicating a probability that the lead will convert (e.g., the likelihood that the potential customer described by a lead will purchase a good and/or service from the advertiser). The marketing system may generate filtered leads based on the assigned lead score. In some examples, filtered leads include only leads having a lead score indicating a probability that the leads will convert is greater than a lead score threshold value.

The marketing system may be programmed to adapt the lead scoring and/or filtering process to changes in the quality of incoming leads. Lead quality may change for various reasons. In some examples, a single publisher may publish the same ad content through multiple web pages or other sources. For example, a publisher may produce a serious news web page along with a less serious or tabloid-type news web page. Leads from readers of one web page over the other may be more likely to convert. Over time, the mix of leads provided by the publisher may change, causing a change to the quality of leads from the publisher.

The marketing system may be programmed to monitor a scrub rate of leads from a particular publisher. If the scrub rate deviates from its historical value by more than a threshold amount, the marketing system may adapt the lead scoring and/or filtering process. Adapting the lead scoring process may include changing one or more scoring parameters affecting the way that lead scores are determined. For example, scoring parameters may include coefficients of a predictive model used to assign lead scores to leads. Adapting the filtering process may include changing one or more filtering parameters affecting the way that the scored leads are filtered. For example, a lead score threshold for filtering may be a filtering parameter. In this way, the marketing system may adapt to changes in lead score quality. When a scoring and/or filtering parameter is modified, subsequent leads may be scored and/or filtered with the new scoring and/or filtering parameters.

FIG. 1 is a diagram showing one example of an environment 100 for adaptive lead generation. The environment includes a computerized marketing system 102, publisher systems 104A, 104B, an advertiser system 106A and potential customers 108. The marketing system 102 may comprise one or more servers or other computing devices programmed to adaptively generate leads, as described herein. The marketing system 102 may comprise components 110, 112, 118, 120. Components 110, 112, 118, 120 may be implemented by the marketing system 102 in any suitable combination of hardware or software. Similarly, the publisher systems 104A, 104B and advertiser system 106A may comprise one or more servers or other computing devices programmed to execute as described herein. Potential customers 108 may include people who interact with one or more of the systems 102, 104A, 104B, 106A, as described herein. Potential customers 108 may interact with one or more of the systems 102, 104A, 104B, 106A utilizing any suitable computing device, for example, as described in FIG. 2.

The marketing system 102 may, optionally, include an ad content component 110. The ad content component 110 may comprise one or more programmed servers or other computing devices. In some examples, the ad content component 110 may be executed on a common computing device with one or more of the other components 112, 114, 118, 120 of the marketing system 102. The ad content component 110 provides ad content 124 to one or more of the publisher systems 104A, 104B. Although two publisher systems 104A, 104B are shown, the ad content component 110 may provide ad content 124 to any suitable number of publisher systems. The ad content 124 may include information describing goods and/or services provided by an advertiser or other entity. Also, in some examples, the ad content 124 may include a Universal Resource Locator (URL) or other suitable address for the lead interface 122, described in more detail below.

Publisher systems 104A, 104B provide publisher interfaces 126A, 126B, 126C, 126D to the potential customers 108. Publisher interfaces 126A, 126B, 126C, 126D may include content provided by the publisher systems 126A, 126B (publisher content) and ad content that is or is derived from ad content 124. Publisher content and ad content included in the publisher interfaces 126A, 126B, 126C, 126D may include, for example, text, images, audio files, video files, etc. Publisher interfaces 126A, 126B, 126C, 126D may include any suitable interface or interfaces for providing publisher content to the potential customers 108. For example, one or more of the publisher interfaces 126A, 126B, 126C, 126D may include a website served to the potential customers. In some examples, one or more of the publisher interfaces 126A, 126B, 126C, 126D may include an e-mail sent to the potential customers. Although four publisher interfaces 126A, 126B, 126C, 126D are shown in FIG. 1, any suitable number of publisher interfaces may be included in the environment 100. In some examples, a single publisher system 104A may serve more than one publisher interface 126A, 126B, 126C, 126D.

The potential customers 108 may receive one or more of the publisher interfaces 126A, 126B, 126C, 126D. As described above, publisher interfaces 126A, 126B, 126C, 126D may include a link to the lead interface 122. A potential customer 108 with interest in the goods and/or services described by the ad content in a publisher interface 126A, 126B, 126C, 126D may select the link in the interface 126A, 126B, 126C, 126D. The link may point to the lead interface 122, which may be served by a lead generator component 114 of the marketing system 102.

The lead generator component 114 may comprise one or more programmed servers or other computing devices. In some examples, the lead generator component 114 may be executed on a common computing device with one or more of the other components 110, 112, 118, 120 of the marketing system 102. The lead generator component 114 may generate and serve the lead interface 122 to one or more of the potential customers 108 (e.g., one or more of the potential customers 108 who select the described link in a publisher interface 126A, 126B, 126C, 126D). The lead interface 122 may prompt a potential customer to provide lead information about the potential customer. The lead information may include information about the potential customer including, for example, the potential customer's name, age, e-mail address, mailing address, phone number, etc. Lead information may also include information specific to the product and/or service indicated by the ad content. For example, where the product is home-delivered food service, the lead interface 122 may prompt the potential customer to provide the number of people in their household, the number of meals that their household eats at home in a week, etc. In another example where the product is a dry-cleaning service, the lead interface 122 may prompt the potential customer to provide the number of dry cleaned items that the potential customer's household wears in a week, etc. The lead generator component 114 may be programmed to receive and process lead data received from the potential customers 108 via the lead interface 122 into leads. As described above, a lead may include lead information describing a potential customer. The lead generator component 114 may process lead data into leads in any suitable format.

In some examples, the lead generator component 114 also categorizes leads. Any suitable categories may be used. For example, leads may be categorized by vertical, by advertiser, by product, by publisher, etc. A vertical or business area category for a lead may describe a category of goods and/or services that the potential customer may be interested in purchasing. Example verticals include education (for potential customers with interest in attending an educational institution), home security (for potential customers interested in purchasing a home security system and/or service), insurance (for potential customers interested in purchasing car, home, or other insurance), etc. An advertiser category for a lead may describe the advertiser whose products are of interest to the potential customer. For example, an advertiser may be a particular educational institution, a particular home security system, etc. A product category for a lead may describe a particular product (or service) of interest to the potential customer. An example product within a home security vertical for a particular advertiser may be a particular model of security system or a particular type of monitoring services. A publisher category for a lead may describe the publisher from which the lead was generated.

For example, if the potential customer described by a lead accessed the lead interface 122 via a link from the publisher system 104A, the publisher category of the resulting lead may describe the publisher implementing the publisher system 104A. In some examples, a category or categories for a lead may be embedded into the lead itself. For example, data describing the potential customer may be supplemented with data describing one or more categories of the lead.

A lead scorer component 118 may apply a predictive model to leads generated by the lead generator component 114 and assign to each considered lead a lead score. The lead scorer component 118 may comprise one or more programmed servers or other computing devices. In some examples, the lead scorer component 118 may be executed on a common computing device with one or more of the other components 110, 112, 114, 120 of the marketing system 102. Any suitable predictive model may be used including, for example, a decision tree or random forest correlation model, a linear regression model, a non-linear regression model, an evolutionary model, a neural network model, a Bayesian model, etc. The lead scorer component 118 may apply the predictive model to a lead to generate a lead score. The lead score is a value indicating a probability that the lead will convert (e.g., the probability that the potential customer described by the lead will purchase a good or service from the advertiser). The lead score may be expressed on any suitable scale such as, for example, from 0 to 1, from 0 to 100, etc. The lead scorer component 118, in some examples, may execute in a cyclic manner. For example, the lead scorer component 118 may operate once a day, twice a day, once an hour, etc. During each operation, the lead scorer component 118 may act on leads received since the execution of its previous cycle. These may be referred to as cycle leads or execution cycle data. Execution cycle data may be received by the lead scorer component 118 continuously, intermittently, or in batches.

In some examples, the lead scorer component 118 also trains the predictive model. For example, the lead scorer component 118 may receive conversion data for a training set of leads, for example, from an advertiser. The training set of leads may be previously-generated leads that were provided to the advertiser. The advertiser, or other suitable party, may generate conversion data for the training set of leads by tallying whether the training leads were successfully converted (e.g., whether the potential customer described by the lead purchased a good or service from the advertiser). Accordingly, the lead scorer component 118 may select predictive scoring parameters based on the training set and the conversion data. Predictive scoring parameters may include, for example, coefficients of one or more equations of the predictive model, A lead filter component 120 may filter leads generated by the lead generator component 114 and scored by the lead scorer component 118. The lead filter component 120 may comprise one or more programmed servers or other computing devices. In some examples, the lead filter component 120 may be executed on a common computing device with one or more of the other components 110, 112, 114, 118 of the marketing system 102. In some examples, the lead filter component 120 may apply a lead score threshold. Leads with a lead score exceeding the lead score threshold may be included in a set of filtered leads 130. Leads with a lead score less than or equal to the lead score threshold may not be included in the filtered leads 130. Because a lead score describes the likelihood that a potential customer will convert (e.g., purchase the advertised product and/or service), the filtered leads 130 may describe potential customers that are most likely to convert. Filtered leads 130 may be provided to an advertiser or other party that, for example, may use the filtered leads 130 to direct additional marketing. The lead filter component 120 may apply filter parameters such as, for example, the lead score threshold. The filtering parameters may be changeable, as described herein. When the lead filter component 120, for example, receives a new lead score threshold for leads (or for leads in certain categories or combinations of categories), subsequent leads (or subsequent leads in the indicated categories) may be filtered according to the new lead score threshold.

In some examples, the environment 100 also includes one or more advertiser systems 106A. Advertiser systems, such as the example advertiser system 106A, may be implemented by an advertiser (e.g., a business entity that is selling goods and/or services or a representative of the business entity that is selling goods and/or services). The advertiser system 106A may provide to the potential customers an advertiser interface 128 that provides content related to the goods and/or services for sale. For example, when the advertiser is an educational institution, the advertiser interface 128 may be a website for the advertiser. The advertiser interface 128 may comprise a link to the lead interface 122 that may allow potential customers 108 who receive the advertiser interface 128 to select the link and proceed to the lead interface 122 as described herein.

Figure 2:
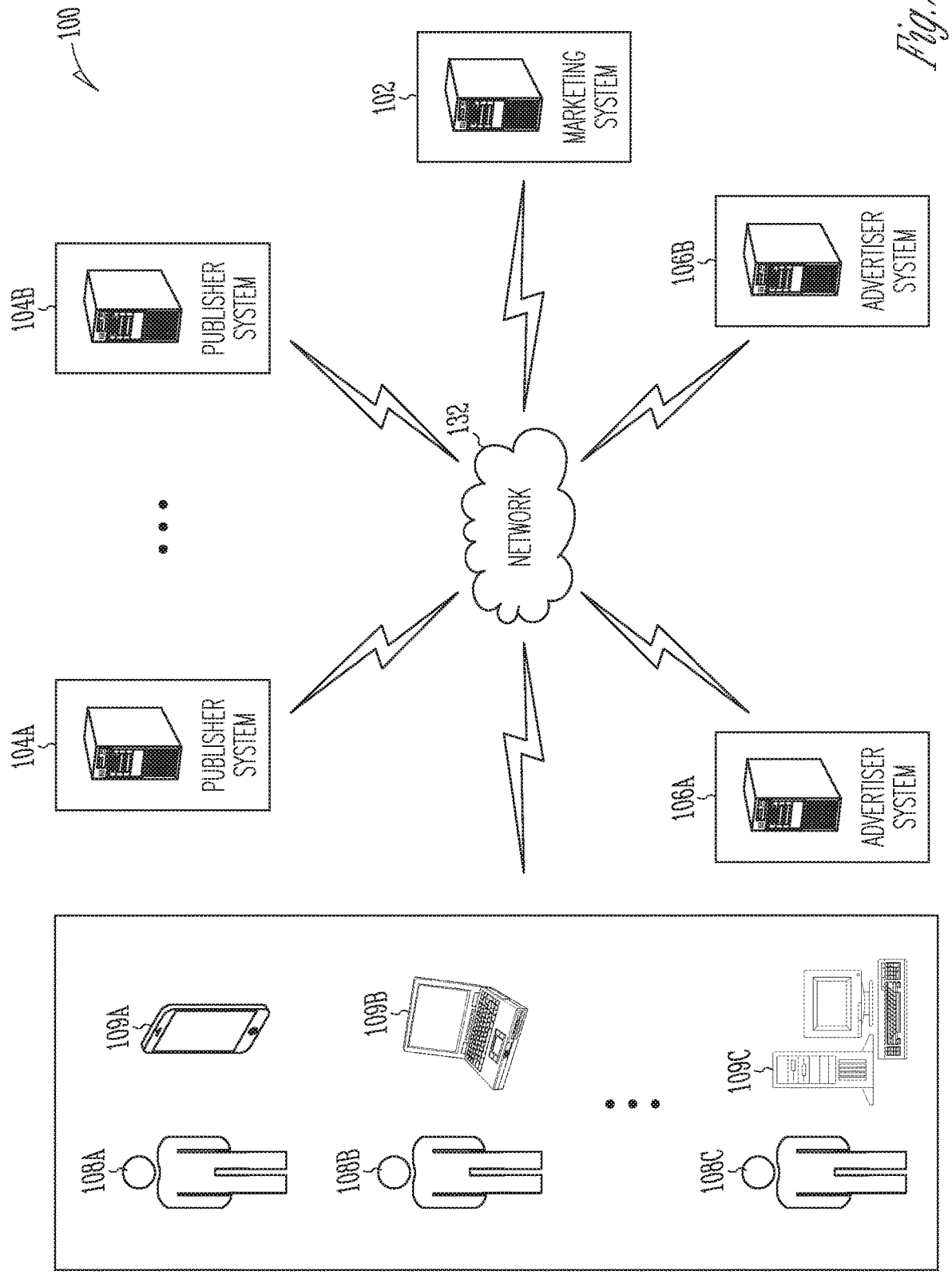
FIG. 2 is a diagram showing another example of the environment of FIG. 1 with additional components.

FIG. 2 is a diagram showing another example of the environment 100 of FIG. 1 with additional components. FIG. 2 shows the marketing system 102, publisher systems 104A, 104B, and advertiser system 106A described above. FIG. 2 also shows an additional advertiser system 106B. For example, the marketing system 102 may be programmed to execute adaptive lead generation for more multiple advertisers at the same time. It will be appreciated that any suitable number of the systems 104A, 104B, 106A, 106B, 102, etc. may be included in the environment 100.

FIG. 2 also shows potential customers 108A, 108B, 108C utilizing customer computing devices 109A, 109B, 109C. Although three customers 108A, 108B, 108C and three customer computing devices 109A, 109B, 109C are shown in FIG. 2, any suitable number of potential customers 108A, 108B, 108C may receive publisher interfaces 126A, 126B, 126C, 126D and/or advertiser interface 128. Similarly, any suitable number of potential customers 108A, 108B, 108C may interact with the lead interface 122.

Potential customers 108A, 108B, 108C may receive and interact with publisher interfaces 126A, 126B, 126C, 126D, advertiser interface 128, and/or lead interface 122 utilizing customer computing devices 109A, 109B, 109C. Customer computing devices 109A, 109B, 109C may include any computing device suitable for receiving and/or interacting with a user interface. For example, customer computing device 109A may be a tablet computing device and/or mobile phone. Customer computing device 109B may be a laptop computer. Customer computing device 109C may be a desktop computer. Customer computing devices 109A, 109B, 109C, however, may include any other suitable computing device.

The various components of the environment 100 may be in communication with one another via a network 132. The network 132 may be or comprise any suitable network element operated according to any suitable network protocol. For example, one or more portions of network 132 may be an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the Public Switched Telephone Network (PSTN), a cellular telephone network, a wireless network, a Wi-Fi network, a WiMax network, another type of network, or a combination of two or more such networks.

Figure 3:
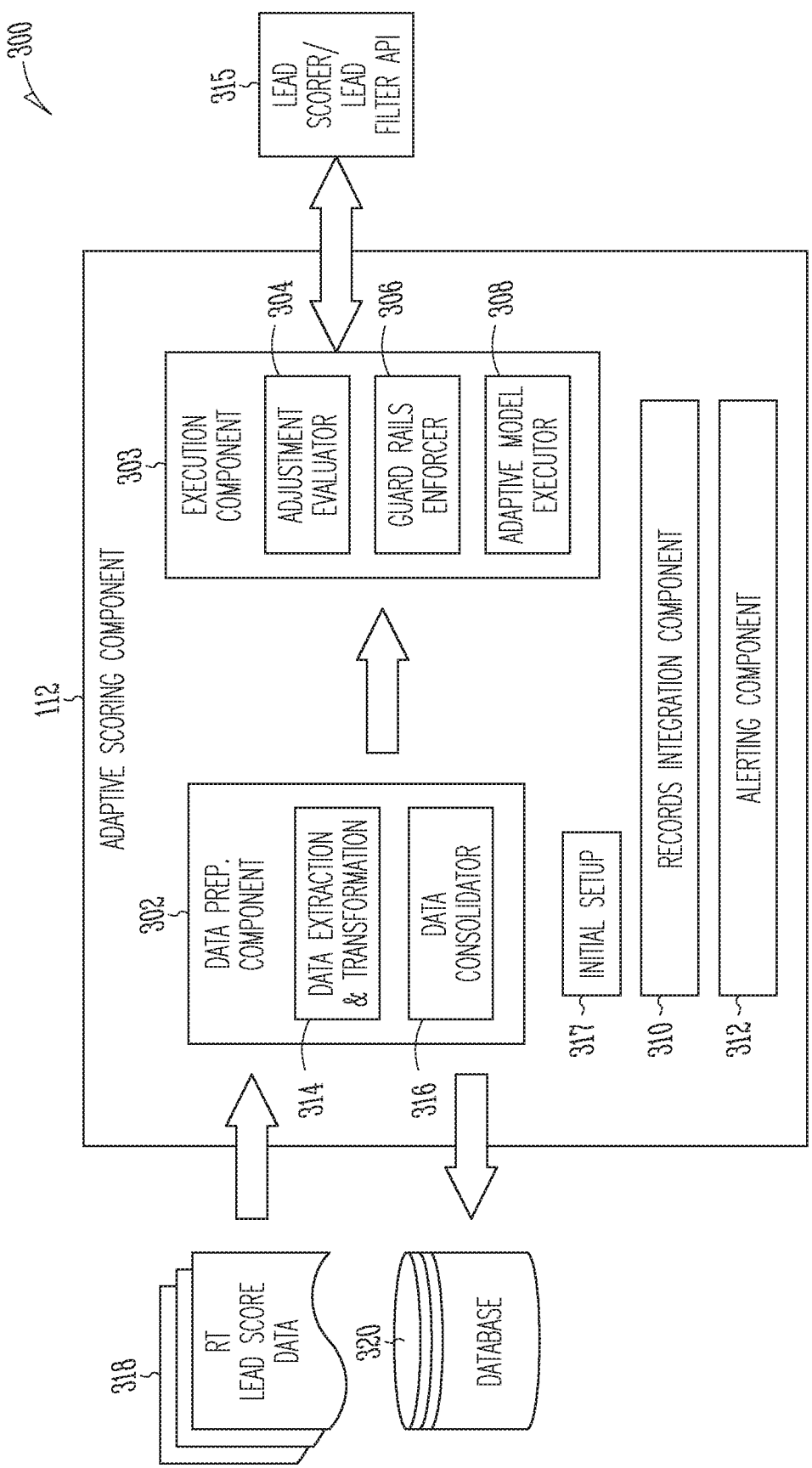
FIG. 3 is a diagram showing one example of the adaptive scoring component.

FIG. 3 is a diagram showing one example of the adaptive scoring component 112. The adaptive scoring component 112 may comprise a data preparation component 302, an execution component 303, and an initial setup component 317. The initial setup component 317 may be configured to initialize the operation of the adaptive scoring component 112, for example, as described herein. In some examples, the adaptive scoring component 112 may be implemented utilizing the Apache Spark cluster computing framework.

The data preparation component 302 may receive lead score data 318. Lead score data 318 may describe received leads and lead scores assigned to the leads by the lead scorer component 118. In some examples, the lead score data 318 is real time data. For example, the lead score data 318 may include lead scores generated by the lead scorer component 118 as the lead scores are generated. Lead scores are calculated based on answers provided by the potential customers to questions posed via the lead interface 122. In some examples, each lead (e.g., each potential customer) may receive an individual lead score. In some examples, the lead score data may include an estimated lead score, a current cut-off threshold to control if the lead/consumer has a sufficient likelihood to convert and submit to an advertiser. The data preparation component 302 may receive the lead score data 318 and format the data for analysis and action by the execution component 303.

In addition to lead score data, the adaptive scoring component 112 may, in some examples, receive and/or derive traffic data. Traffic data may include traffic statistics describing incoming leads such as, for example, lead volume, a volume or rate of leads scrubbed (e.g., omitted from the filtered leads 130), etc. In some examples, traffic data may be broken out by category or combination of categories. For example, lead score data 318 may include a description of the scrub rate for leads in a particular combination of date, vertical category, product category, advertiser category, and publisher category.

In some examples, the data preparation component 302 includes a data extraction and transformation component 314 and a data consolidator component 316. The data extraction and transformation component 314 may perform various formatting, deduplication, transformation and/or aggregation operations on the lead score data 318. The data consolidator component 316 may generate records of aggregated lead score data, which may be stored at a database 320. Additional details of the operation of the data preparation component 302 are provided herein, for example, with respect to the process flow 400 of FIG. 4.

The execution component 303 may comprise an adjustment evaluator component 304. The execution component 303 may also comprise a guard rails enforcer 306 and/or an adaptive model executor component 308. The adjustment evaluator component 304 may receive lead score data 318 via the data preparation component 302. Based on the lead score data 318, the adjustment evaluator may determine an adjustment to the lead scorer component 118 and/or the lead filter component 120. An adjustment to the lead filter component 120 may be, for example, a change to the lead score threshold value applied by the lead filter component 120 or other filtering parameter. The guard rails enforcer component 306 may apply one or more limitation rules to the lead filter component or lead scorer component adjustment determined by the model scrub adjustment evaluator component 304. The optional model executor component 308 may derive a change to the predictive model used by the lead scorer component 118 to assign lead scores to leads. For example, the model executor component 308 may re-train the predictive model utilized by the lead scorer component 118, for example, based on newly received leads. In some examples, the model executor component 308 may automatically regenerate an entire predictive model utilized by the lead scorer component 118, for example, based on new and ever-changing input. Changes to the lead filter component 120 and/or the lead scorer component 118 may be communicated to one or both of those components 118, 120 via a lead scorer/lead filter application program interface (API) 315.

In some examples, the adaptive scoring component comprises a records integration component 310. The records integration component 310 may be utilized to document changes made to the lead scorer component 118 and/or the lead filter component 120. For example, when the execution component 303 pushes a change to either the lead scorer component 118 or the lead filter component 120 (e.g., via the API 315), it may also be programmed to initiate a records task ticket, which is provided to the records integration component 310. The records integration component 310 may be implemented with any suitable technology. In some examples, the records integration component 310 includes and/or interfaces with a project management tool, such as the JIRA product available from Atlassian.

The records task ticket may include data describing the proposed change to the lead scorer component 118 or lead filter component 120. For example, a records task ticket may include values for one or more scoring and/or filtering parameters both before and after the proposed change. For example, if the proposed change includes a modification to the lead score threshold applied by the lead filter 120 (e.g., a filtering parameter), the records task ticket may describe the previous lead score threshold and the proposed new lead score threshold. If the change includes a modification to the lead scorer component 118, the records task ticket may include a description of the model applied by the lead scorer component 118 both before and after the proposed change (e.g., one or more scoring parameters). The description of the model may include, for example, model coefficients, offsets, or any other model description. In some examples, a records task ticket may also include a description of the scrub rate or other metric describing the operation of the lead scorer component 118 or lead filtering component 120 prior to the change.

Upon receiving a records task ticket, the records integration component 310 may monitor the scrub rate or other indicator of the operation of the lead scorer component 118 and/or lead filtering component 120. The records integration component 310 may generate a records entry including some or all of the data from the records task ticket and the scrub rate or other indicator of the operation of the lead scorer component 118 both before and after the proposed change in implemented. The records entry may be stored at any suitable database including, for example, the database 320.

The alerting component 312 may also receive an alert ticket from the execution component 303 when a change is proposed to the lead scorer component 118 and/or the lead filter component 120. The alert ticket may describe a proposed change to the lead scorer component and/or lead filter component 120 (e.g., a change to a scoring and/or filter parameter). In some examples, an alert ticket may include data similar to the data described above as being included in the records task ticket. In response to the alert ticket, the alerting component 312 may generate and send a message to one or more administrators of the marketing system 102. The message may be sent, for example, by e-mail, text (e.g., short message service SMS), or any other suitable medium. The message may include some or all of the data described above as potentially included in a records entry generated by the records integration component 310. In some examples, the alerting component 312 may send a message describing a proposed change to the lead scorer component 118 or the lead filter component 120 before the change is implemented. This may enable the administrator receiving the message to manually intercede to cancel or change the modification if desirable. For example, the execution component 303 may be programmed to send the alert ticket to the alerting component 312 and then wait a threshold time (e.g., 30 minutes) before executing the change to the lead scorer component 118 and/or lead filter component 120 described by the alert ticket.

Figure 4:
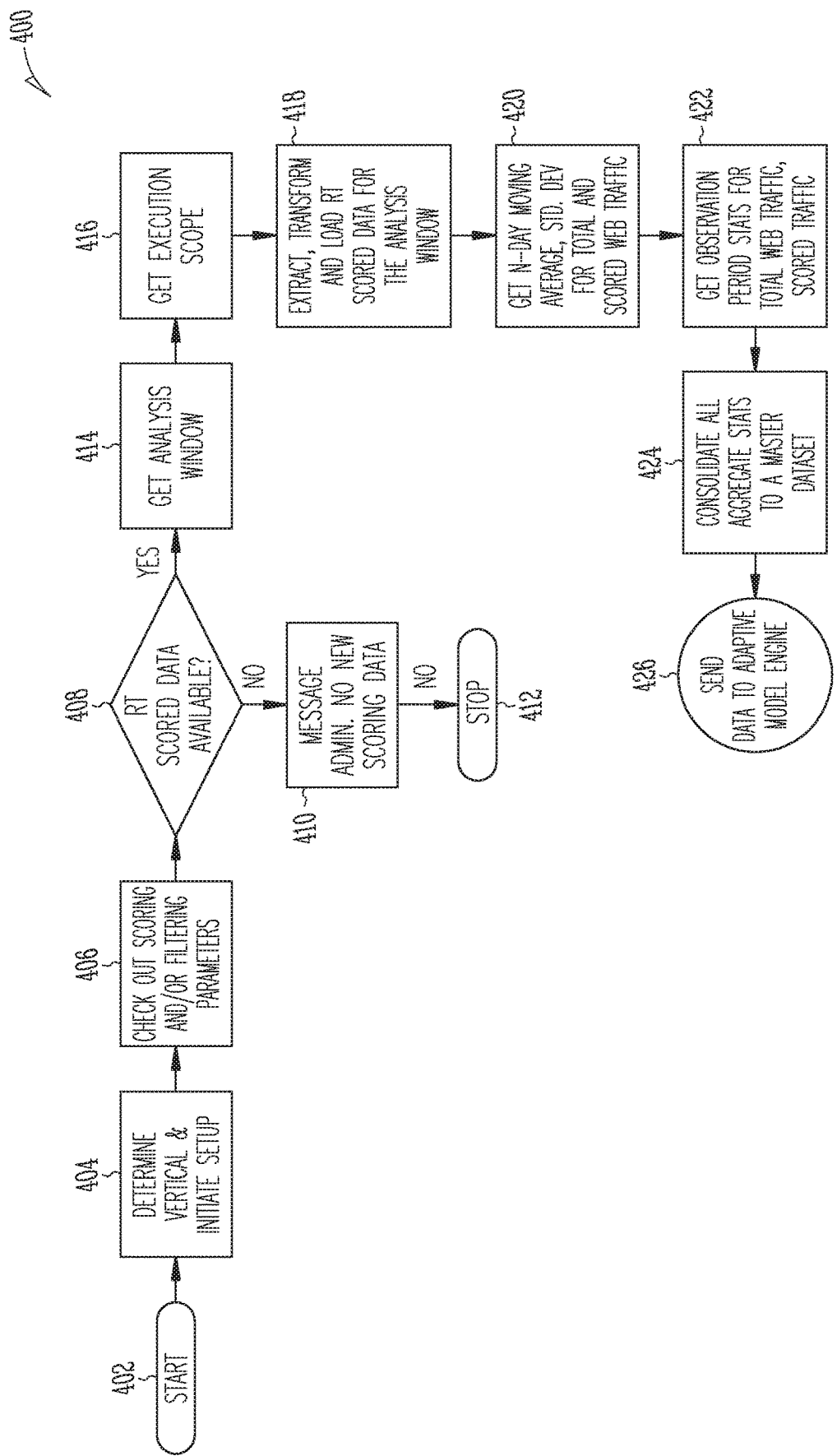
FIG. 4 is a flowchart showing one example of a process flow 400 that may be executed to receive and process lead score data 318.

FIG. 4 is a flowchart showing one example of a process flow 400 that may be executed to receive and process lead score data 318. The process flow 400 may begin at action 402. The process flow 400 may begin at any suitable interval or time. In some examples, the process flow 400 may execute when real-time lead score data 318 is received (e.g., lead score data 318 that was generated by the lead scorer component 118 within a threshold time of receipt and/or lead score data 318 that has not yet been processed by the data preparation component 302). Also, in some examples, the process flow 400 may execute continuously.

At action 404, the initial setup component 317 may determine and/or receive a vertical or business domain category of the lead score data 318 to be processed. For example, the lead score data 318 may be formatted a setup file (or other suitable data structure). The initial setup component 317 may examine the setup file to determine the vertical category of the leads therein. In addition, the data preparation component 302 may determine an advertiser list, a product or products represented by the lead score data 318 and publisher list, for example, from the setup file.

At action 406, the data preparation component 302 (e.g., the data extraction and transformation component 314 thereof) may extract the versioned scoring and/or filtering parameters. For example, the data extraction and transformation component 314 may query the lead scorer component 118 to receive the scoring and/or filtering parameters. In some examples, the query is directed to a software versioning and/or revision control server, which may execute any suitable versioning and/or revision control tool such as, Subversion® available from Apache™.

At action 408, the data preparation component 302 (e.g., the data extraction and transformation component 314 thereof) may determine if real time lead score data 318 is available. For example, if real time lead score data is not available, it may indicate that the lead scorer component 118 and/or lead filter component 120 is not operational (e.g., not generating lead score data 318). If real time lead score data 318 is not available, the data extraction and transformation component 314 may initiate a message to an administrator of the marketing system 102. The message may be sent by any suitable medium including, for example, e-mail, SMS message, etc. The message may indicate that there is no new lead scoring data 318 received from the lead scorer component 118 and/or the lead filtering component 120. The administrator, for example, may intervene to determine why the lead scorer component 118 and/or lead filter component 120 is not operating and, optionally, to correct the issue. The process flow 400 may subsequently stop at action 412.

If real time lead score data 318 is received, the data preparation component 302 (e.g., the data extraction and transformation component 314 thereof) may receive an indicator of an analysis window at action 414. The analysis window may describe the time period over which the performance of the lead scorer component 118 and/or lead filter component will be evaluated. For example, the execution component may compare a current scrub rate taken over an observation time period (e.g., a day, an hour) to a scrub rate for leads received over the analysis window (e.g., a week, 15 days, 30 days, a quarter, etc.). At action 416, the data preparation component 302 (e.g., the data extraction and transformation component 314 thereof) may receive an indicator of execution scope for the execution component 303. The execution scope may describe a range of lead categories that the execution component 303 will analyze. For example, the execution scope may comprise one or a set of advertiser categories, one or a set of product categories, etc. The analysis window data and execution scope may be received in any suitable manner. For example, an administrator of the marketing system 102 may set the analysis window and execution scope manually.

At action 418, the data preparation component 302 (e.g., the data extraction and transformation component 314 thereof) may perform data analysis on the lead score data. For example, the lead score data 318 may be received in any suitable format including, for example, a structured or unstructured format. Data analysis may include extracting lead scores from the received data 318, transforming the received data 318 to a structured format, such as a spreadsheet or eXtensible Markup Language (XML), and loading the structured lead score data, for example, to the database 320 (e.g., via the data consolidator component 316). Data analysis, in some examples, also includes deduplication. In some examples, lead score data 318 extracted, transformed, and/or loaded at action 418 may include only the lead score data 318 describing leads received during the analysis window.

At action 420, the data preparation component 302 (e.g., the data extraction and transformation component 314 thereof) may receive and/or generate analysis window statistics describing the received lead score data over the analysis window. Example statistics that may be generated include an average lead score for leads over the analysis period, an n-day moving average of lead scores for leads received during the analysis window, a standard deviation of lead scores for leads received over the analysis period, etc. At action 422, the data preparation component 302 (e.g., the data extraction and transformation component 314 thereof) may receive and/or generate observation period statistics. Observation period statistics may be similar to the analysis window statistics, but may be taken over the observation period. As described herein, the execution component 303 may compare observation period statistics to analysis window statistics to propose changes to the lead scorer component 118 and/or lead filter component 120. The statistics described at actions 418 and 420, in some examples, are received and/or extracted from the lead score data 318. Also, in some examples, some or all of the statistics of actions 418 and 420 are derived from the lead score data 318 and/or from other sources. Also, in some examples, the data preparation component 302 may receive the statistics described at actions 418 and 420 from another source (e.g., the records integration component 310).

At action 424, the data preparation component 302 (e.g., the data consolidator component 316 thereof) may consolidate the structured lead data generated at action 418 and the statistics received and/or generated at actions 420, 422 to generate a master dataset. The master dataset may be in any suitable format including, for example, XML, a spreadsheet, etc. The master dataset, in some examples, may be stored at the database 320. At action 426, the data preparation component 302 may provide the consolidated data to the Execution Component 303.

Figure 5:
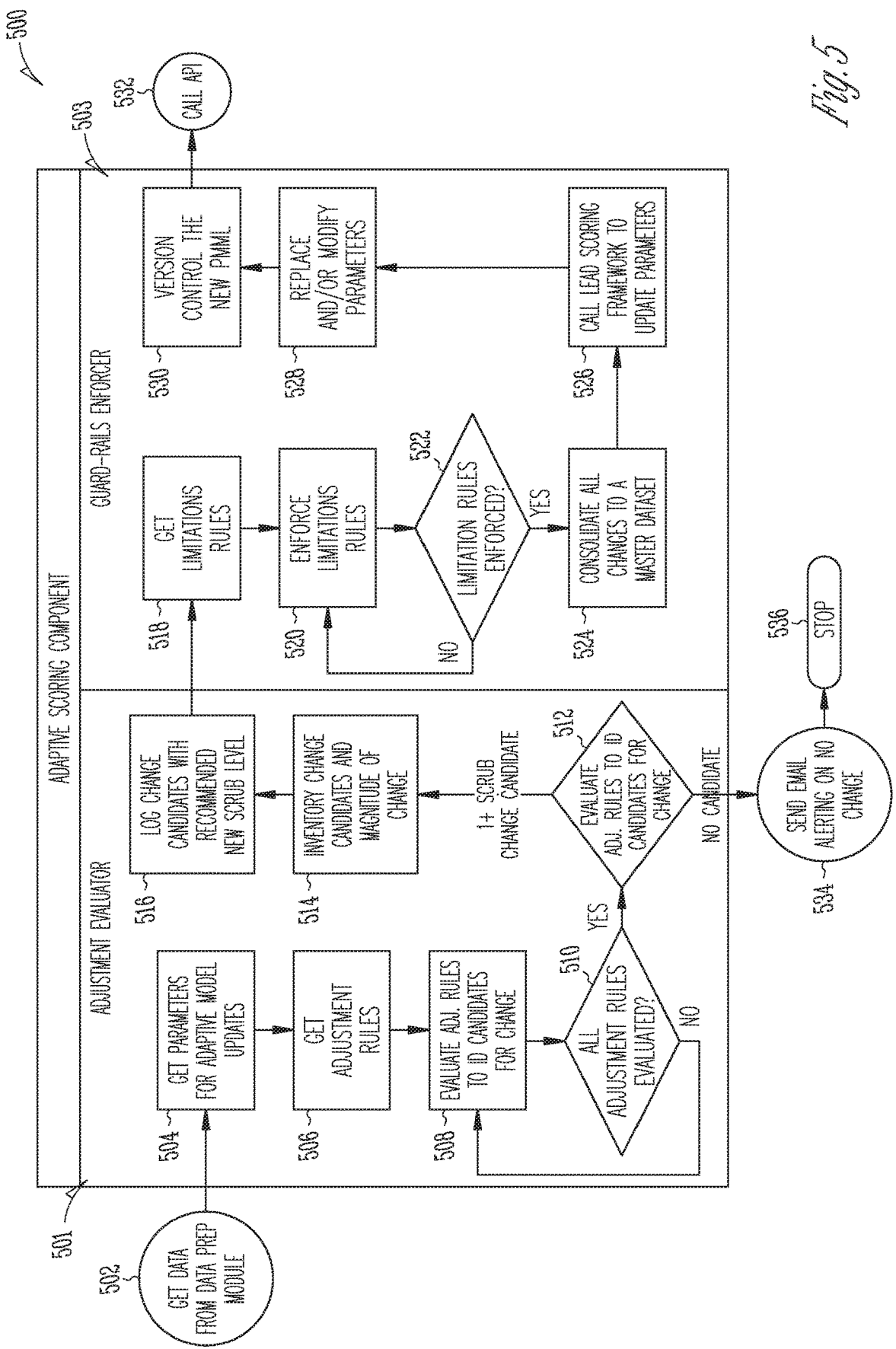
FIG. 5 is a flowchart showing one example of a process flow 500 that may be executed by the execution component of FIG. 3 to generate proposed changes to the lead scorer and/or the lead filter.

FIG. 5 is a flowchart showing one example of a process flow 500 that may be executed by the execution component 303 of FIG. 3 to generate proposed changes to the lead scorer 118 and/or the lead filter 120. The process flow 500 is divided into two portions 501, 503. Portion 501 includes actions that may be executed by the adjustment evaluator component 304. Portion 503 includes actions that may be executed by the guard rail enforcer component 306. For example, as described above, the adjustment evaluator component 304 may generate proposed changes to scoring and/or filtering parameters. The guard-rails enforcer component 306 may apply limitation rules to limit the severity of changes made by the adjustment evaluator component 304. At action 502, the execution component 303 may receive input data from the data preparation component 302. The input data, for example, may be the structured master dataset described above. For example, the input data may include lead scores and/or statistics from the analysis window and/or the observation period.

At action 504, the adjustment evaluator 304 may receive parameters for adaptive model updates. The parameters may include, for example, the filtering parameters and/or scoring parameters that are currently being applied by the lead scorer component 118 and/or the lead filter component 120.

At action 506, the adjustment evaluator component 304 may receive adjustment rules. Adjustment rules may define when the adjustment evaluator component 304 proposes a change to a scoring parameter and/or a filtering parameter. Any suitable adjustment rule may be utilized. One example adjustment rule may require that the mean scrub rate implemented by the lead filter component 120 over the observation period be within plus-or-minus two standard deviations of the mean scrub rate over the analysis window. Another example adjustment rule may set a maximum and/or minimum scrub rate over the observation period. In some examples, adjustment rules may be specific to a particular set of lead categories. Leads belonging to a particular set of lead categories may be referred to as a domain.

In some examples, one or more adjustment rules may call for modifications to a filtering/scoring parameter and/or the minimum lead-score cut-off requirement upon detection of a change in the quality of leads over time (e.g., from one execution cycle to another.) For example, lead quality during an observation period may be compared to lead quality during the analysis window. Lead quality may be measured in any suitable manner. For example, lead quality may be reflected in the scrub rate. If the scrub rate for leads received during the observation period is different than the scrub rate for leads received analysis window by more than a scrub rate threshold, it may indicate that lead quality has changed. In some examples, lead quality may be measured by comparing lead determinative variables to lead scores. A lead determinative variable may be a variable describing a potential customer that tends to suggest that the potential customer is either more likely than average or less likely than average to convert. For example, in a vertical category of car dealers, a potential customer without a drivers license may be relatively less likely to convert (e.g., buy a car) than similarly situated potential customers that have drivers licenses. A lead determinative variable may conflict with a lead score if the lead determinative variable and the lead score differ. If more than a threshold number of leads in an execution cycle have lead determinative variables differing from the determined lead score, it may indicate a drop in lead quality.

At action 508, the adjustment evaluator component 304 may evaluate the input data in view of the adjustment rules and identify candidate scoring and/or filtering parameters for change. Changes may be proposed for any suitable scope of leads. In some examples, changes may be proposed for leads assigned to categories similar to those of the leads received by the data preparation component 302. For example, the adjustment evaluator component 304 may determine if any of the adjustment rules are satisfied by a unique combination of advertiser, vertical, product and publisher from the lead score data. Scrub rate may be estimated for each unique combination of advertiser, vertical, product and publisher from lead score data. Scrub rate may be the ratio of number of customers whose lead score who are removed from marketing system 102 (because their lead score is below the current predefined model cut-off/threshold) to the total number of customers in the Marketing System. If so, the adjustment evaluator component 304 may generate a proposed modification to the scoring parameters and/or the filtering parameters. For example, if the scrub rate for the observation period is too high, the adjustment evaluator component 304 may propose a reduction to the lead score threshold applied by the lead filtering component 120.

Changes to scoring and/or filtering parameters may be implemented in any suitable manner. For example, if the adjustment evaluator 304 determines that a change to the scrub rate is desired, it may analyze leads received during the observation period and select a new lead score threshold that would drive the scrub rate to the desired value for the leads received during the observation period. This may be set as the new lead score threshold for the lead filter 120.

At action 510, the adjustment evaluator component 304 may determine whether all of the adjustment rules have been evaluated. If not, the adjustment evaluator component 304 may return to action 508 and evaluate one or more additional adjustment rules. If all adjustment rules are evaluated, the adjustment evaluator component 304 may determine, at action 512, whether any changes to filtering parameters and/or scoring parameters have been proposed. If not, the adjustment evaluator component 304 may, at action 534, send a message to one or more administrators indicating that no change to the filtering and/or scoring parameters is proposed. Upon initiating the message, the adjustment evaluator 304 may stop its processing at action 536.

If a change to a filtering and/or scoring parameter is proposed, the adjustment evaluator 304 may, at action 514, inventory parameter change candidates including the magnitude of the proposed changes. At action 516, the adjustment evaluator component may log change candidates including the recommended new scrub level. In some examples, inventorying parameter change candidates may include recording the proposed parameter changes as well as, for example, statistics describing the lead scores that lead to the proposed changes, new and old scrub thresholds, etc. A generated inventory of parameter changes may be provided, for example, to the records integration component 310 for storage and/or distribution. A log of the proposed parameter changes may include a less data than an inventory and, for example, may be provided to the alerting component 312 for distribution to administrative users. In some examples, one or both of actions 514 and 516 may be omitted and/or combined into a single action.

At action 518, the guard rails enforcer component 306 may receive limitation rules, sometimes referred to as guard rails or guard rail rules. The guard rails enforcer component 306 may enforce the limitations rules at action 520. Like adjustment rules, limitation rules, in some examples, are specific to a particular domain. Any suitable limitation rules may be used. In some examples, a limitation rule may set minimum or maximum lead score thresholds. In another example, a limitation rule may limit the number of positive and/or negative changes that can be made to the lead score threshold over a given time period. For example, if the adjustment evaluator 304 proposes more than three increases to the lead score threshold in a one month period, the guard rails enforcer component 306 may disallow the fourth and subsequent proposed increases during the one month period.

At action 522, the guard rails enforcer component 306 may determine if all limitation rules have been enforced. If not, the guard rails enforcer component 306 may enforce additional limitation rules at action 520. If all limitation rules have been enforced, the guard rails enforcer component 306 may consolidate all changes remaining after application of the limitation rules at action 524. At action 526, the guard rails enforcer may call the lead scoring component 118 and/or the lead filter component 120 to receive current filtering and/or scoring parameters. Filtering and/or scoring parameters, in some examples, are represented utilizing Predictive Model Markup Language (PMML), though any other suitable syntax may be used. The guard rails enforcer component 306 may query the lead scorer component 118 and/or lead filter component 120 via the API 315.

At action 528, the guard rails enforcer 306 may generate a new set of lead scoring and/or filtering parameters. For example, the guard rails enforcer 306 may modify the PMML or other model representation received from the lead scorer component 118 and/or lead filter component 120. At action 530, the guard rails enforcer 306 may perform version control on the new scoring and/or filtering parameters. Version control may include, for example, assigning a new version number to the parameters as modified. The guard rails enforcer 306, in some examples, may manage version control in conjunction with a versioning and/or revision control server, as described herein. At action 530, the guard rails enforcer component 306 may call the API 315 and provide the new and/or updated parameters to the lead scorer component 118 and/or the lead filter component 120.

Figure 6:
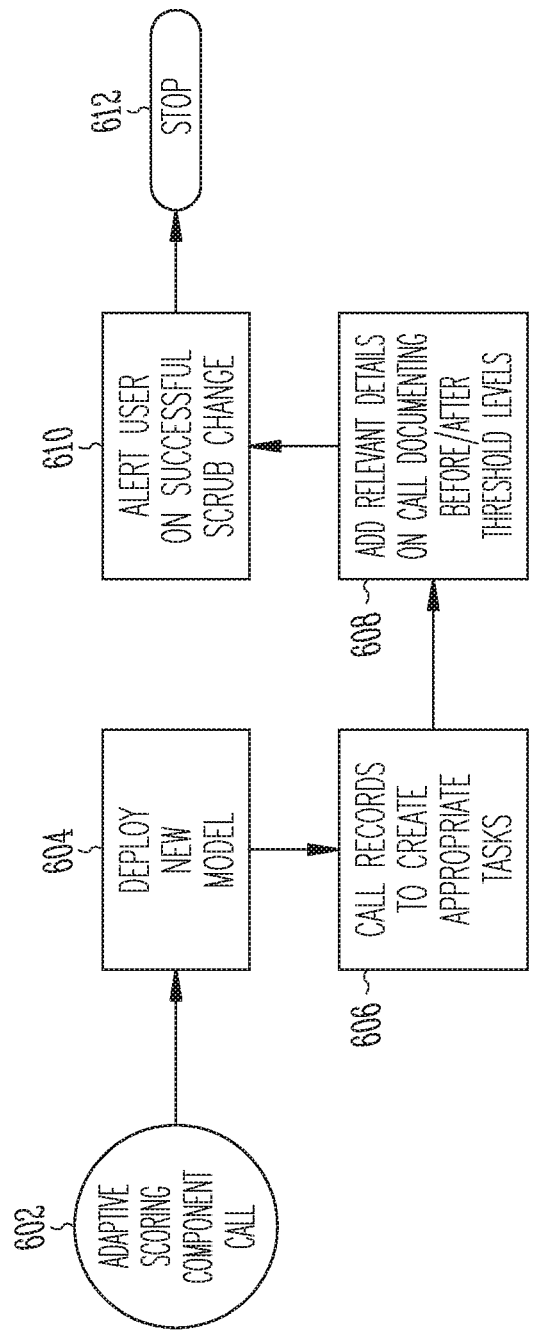
FIG. 6 is a flowchart showing one example of a process flow 600 that may be executed by the API of FIG. 3 to process new scoring and/or filtering parameters.

FIG. 6 is a flowchart showing one example of a process flow 600 that may be executed by the API 315 to process new scoring and/or filtering parameters. At action 602, the API 315 may receive a call (e.g., from the execution component) requesting that new scoring filtering parameters and/or new lead score cut-off threshold to be deployed. In some examples, the call may include a PMML or other representation of the model utilized by the lead scorer component 118 to score leads and/or by the lead filter component 120 to filter leads. The PMML or other model representation, for example, may reflect modifications to scoring parameters and/or filtering parameters. In some examples, whether the call includes a full representation of a model or simply parameters to be changed or updated, the call may refer to a model executed by the lead scorer component 118 and/or the lead filter component 120.

At action 604, the API 315 may deploy a new model to the lead scorer component 118 and/or the lead filter component 120. At action 606, the API 315 may call the records integration component 310, which may record the parameter changes and alert administrators, for example, as described herein. At action 608, the API 315 may, if necessary, add to the call made to the records integration component 310 an indication of before and after values for the scoring and/or filtering parameters to be changed. For example, when the lead score threshold is changed, the call to the records integration component 310 may include an indication of the lead score threshold both before and after the change. At action 610, the API 315 may, optionally, send a message to one or more administrators indicating a successful change to the scoring and/or filtering parameter. The process flow 600, in some examples, may terminate at action 612.

Figure 7:
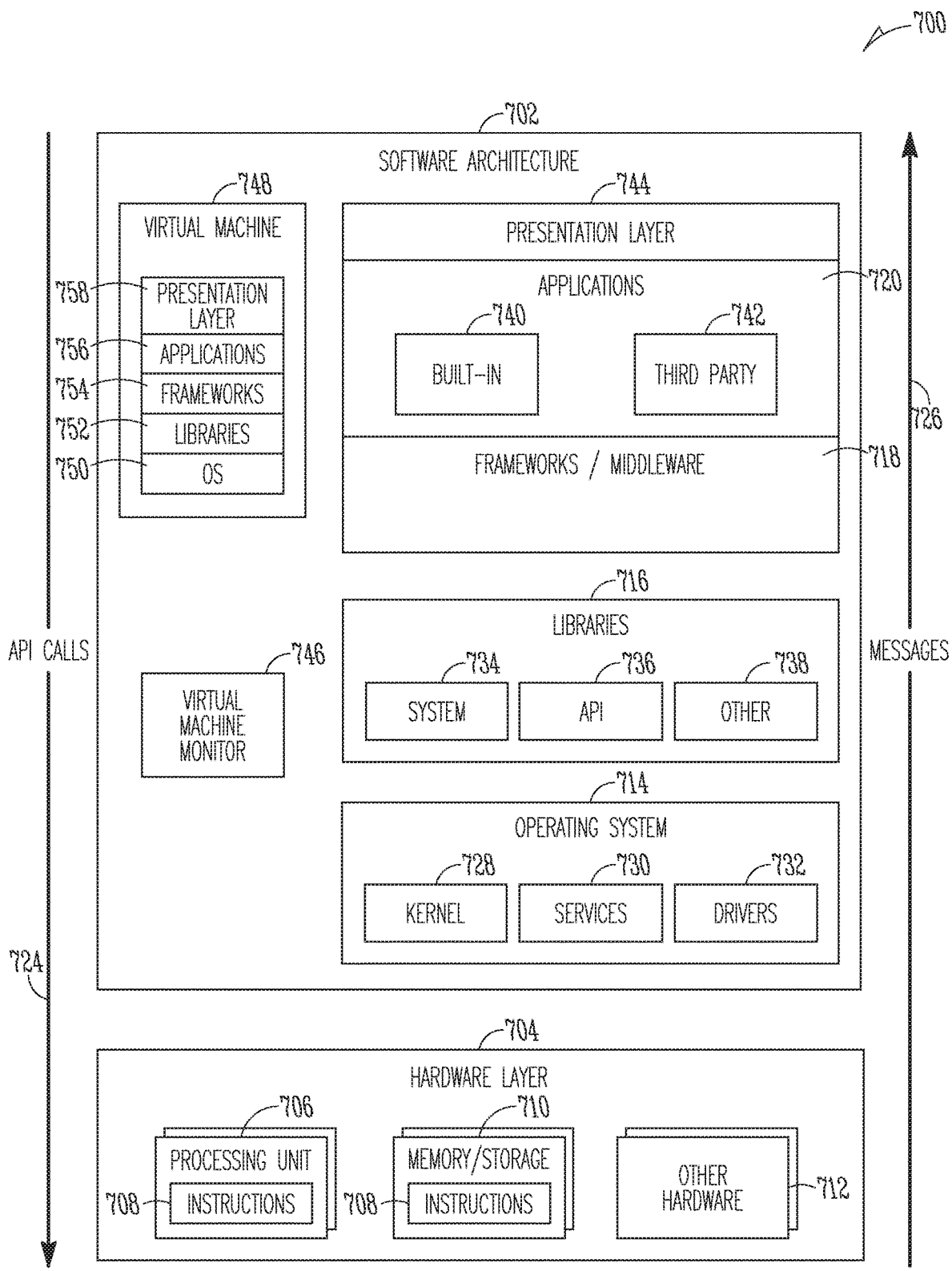
FIG. 7 is a block diagram showing one example of a software architecture for a computing device.

FIG. 7 is a block diagram 700 showing one example of a software architecture 702 for a computing device. The architecture 702 may be used in conjunction with various hardware architectures, for example, as described herein. FIG. 7 is merely a non-limiting example of a software architecture and many other architectures may be implemented to facilitate the functionality described herein. A representative hardware layer 704 is illustrated and may represent, for example, any of the above referenced computing devices.

The representative hardware layer 704 comprises one or more processing units 706A having associated executable instructions 708. Executable instructions 708 represent the executable instructions of the software architecture 702, including implementation of the methods, components, and so forth of FIGS. 1-6. Hardware layer 704 also includes memory and/or storage components 710, which also have executable instructions 708. Hardware layer 704 may also comprise other hardware as indicated by 712 which represents any other hardware of the hardware layer 704, such as the other hardware illustrated as part of hardware architecture 800 of FIG. 8 below.

In the example architecture of FIG. 7, the software 702 may be conceptualized as a stack of layers where each layer provides particular functionality. For example, the software 702 may include layers such as an operating system 714, libraries 716, frameworks/middleware 718, applications 720 and presentation layer 744. Operationally, the applications 720 and/or other components within the layers may invoke application programming interface (API) calls 724 through the software stack and receive a response, returned values, and so forth illustrated as messages 726 in response to the API calls 724. The layers illustrated are representative in nature and not all software architectures have all layers. For example, some mobile or special purpose operating systems may not provide a frameworks/middleware layer 718, while others may provide such a layer. Other software architectures may include additional or different layers.

The operating system 714 may manage hardware resources and provide common services. The operating system 714 may include, for example, a kernel 728, services 730, and drivers 732. The kernel 728 may act as an abstraction layer between the hardware and the other software layers. For example, the kernel 728 may be responsible for memory management, processor management (e.g., scheduling), component management, networking, security settings, and so on. The services 730 may provide other common services for the other software layers. The drivers 732 may be responsible for controlling or interfacing with the underlying hardware. For instance, the drivers 732 may include display drivers, camera drivers, Bluetooth® drivers, flash memory drivers, serial communication drivers (e.g., Universal Serial Bus (USB) drivers), Wi-Fi® drivers, NFC drivers, audio drivers, power management drivers, and so forth depending on the hardware configuration.

The libraries 716 may provide a common infrastructure that may be utilized by the applications 720 and/or other components and/or layers. The libraries 716 typically provide functionality that allows other software modules to perform tasks in an easier fashion than to interface directly with the underlying operating system 714 functionality (e.g., kernel 728, services 730 and/or drivers 732). The libraries 716 may include system 734 libraries (e.g., C standard library) that may provide functions such as memory allocation functions, string manipulation functions, mathematic functions, and the like. In addition, the libraries 716 may include API libraries 736 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 9D in a graphic content on a display), database libraries (e.g., SQLite that may provide various relational database functions), web libraries (e.g., WebKit that may provide web browsing functionality), and the like. The libraries 716 may also include a wide variety of other libraries 738 to provide many other APIs to the applications 720 and other software components/modules.

The frameworks 718 (also sometimes referred to as middleware) may provide a higher-level common infrastructure that may be utilized by the applications 720 and/or other software components/modules. For example, the frameworks 718 may provide various graphic user interface (GUI) functions, high-level resource management, high-level location services, and so forth. The frameworks 718 may provide a broad spectrum of other APIs that may be utilized by the applications 720 and/or other software components/modules, some of which may be specific to a particular operating system or platform.

The applications 720 includes built-in applications 740 and/or third party applications 742. Examples of representative built-in applications 740 may include, but are not limited to, a contacts application, a browser application, a book reader application, a location application, a media application, a messaging application, and/or a game application. Third party applications 742 may include any of the built-in applications as well as a broad assortment of other applications. In a specific example, the third-party application 742 (e.g., an application developed using the Android™ or iOS™ software development kit (SDK) by an entity other than the vendor of the particular platform) may be mobile software running on a mobile operating system such as iOS™, Android™, Windows® Phone, or other mobile operating systems. In this example, the third-party application 742 may invoke the API calls 724 provided by the mobile operating system such as operating system 714 to facilitate functionality described herein.

The applications 720 may utilize built in operating system functions (e.g., kernel 728, services 730 and/or drivers 732), libraries (e.g., system 734, APIs 736, and other libraries 738), frameworks/middleware 718 to create user interfaces to interact with users of the system. Alternatively, or additionally, in some systems interactions with a user may occur through a presentation layer, such as presentation layer 744. In these systems, the application/module "logic" may be separated from the aspects of the application/module that interact with a user.

Some software architectures utilize virtual machines. In the example of FIG. 7, this is illustrated by virtual machine 748. A virtual machine creates a software environment where applications/modules may execute as if they were executing on a hardware computing device. A virtual machine is hosted by a host operating system (operating system 714) and typically, although not always, has a virtual machine monitor 746, which manages the operation of the virtual machine as well as the interface with the host operating system (i.e., operating system 714). A software architecture executes within the virtual machine such as an operating system 750, libraries 752, frameworks/middleware 754, applications 756 and/or presentation layer 758. These layers of software architecture executing within the virtual machine 748 may be the same as corresponding layers previously described or may be different.

Figure 8:
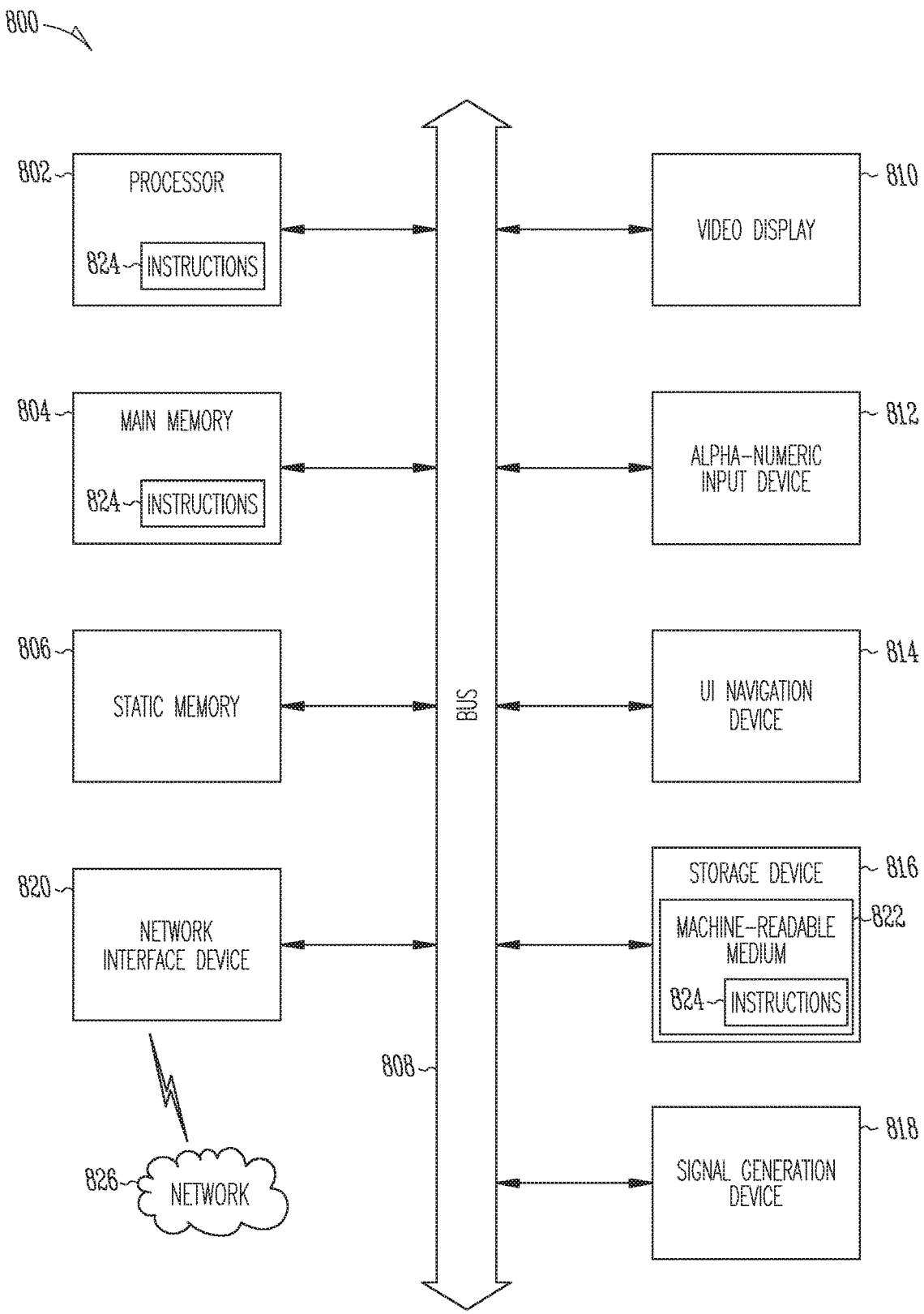
FIG. 8 is a block diagram illustrating a computing device hardware architecture, within which a set or sequence of instructions may be executed to cause the machine to perform examples of any one of the methodologies discussed herein.

FIG. 8 is a block diagram illustrating a computing device hardware architecture 800, within which a set or sequence of instructions may be executed to cause the machine to perform examples of any one of the methodologies discussed herein. For example, the architecture 800 may execute the software architecture 702 described with respect to FIG. 7. The architecture 800 may operate as a standalone device or may be connected (e.g., networked) to other machines. In a networked deployment, the architecture 800 may operate in the capacity of either a server or a client machine in server-client network environments, or it may act as a peer machine in peer-to-peer (or distributed) network environments. The architecture 800 may be implemented in a personal computer (PC), a tablet PC, a hybrid tablet, a set-top box (STB), a personal digital assistant (PDA), a mobile telephone, a web appliance, a network router, switch or bridge, or any machine capable of executing instructions (sequential or otherwise) that specify actions to be taken by that machine.

Example architecture 800 includes a processor unit 802 comprising at least one processor (e.g., a central processing unit (CPU), a graphics processing unit (GPU) or both, processor cores, compute nodes, etc.). The architecture 800 may further comprise a main memory 804 and a static memory 806, which communicate with each other via a link 808 (e.g., bus). The architecture 800 may further include a video display unit 810, an alphanumeric input device 812 (e.g., a keyboard), and a user interface (UI) navigation device 814 (e.g., a mouse). In some examples, the video display unit 810, input device 812 and UI navigation device 814 are incorporated into a touch screen display. The architecture 800 may additionally include a storage device 816 (e.g., a drive unit), a signal generation device 818 (e.g., a speaker), a network interface device 820, and one or more sensors (not shown), such as a global positioning system (GPS) sensor, compass, accelerometer, or other sensor.

The storage device 816 includes a machine-readable medium 822 on which is stored one or more sets of data structures and instructions 824 (e.g., software) embodying or utilized by any one or more of the methodologies or functions described herein. The instructions 824 may also reside, completely or at least partially, within the main memory 804, static memory 806, and/or within the processor 802 during execution thereof by the architecture 800, with the main memory 804, static memory 806, and the processor 802 also constituting machine-readable media. Instructions stored at the machine-readable medium 822 may include, for example, instructions for implementing the software architecture 702, instructions for executing any of the features described herein, etc.

While the machine-readable medium 822 is illustrated in an example to be a single medium, the term "machine-readable medium" may include a single medium or multiple media (e.g., a centralized or distributed database, and/or associated caches and servers) that store the one or more instructions 824. The term "machine-readable medium"

shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including, but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 824 may further be transmitted or received over a communications network 826 using a transmission medium via the network interface device 820 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Wi-Fi, 3G, and 6G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

Examples, as described herein, may include, or may operate on, logic or a number of components, engines, or modules, circuits, which for the sake of consistency are termed circuits, although it will be understood that these terms may be used interchangeably. Circuits may be hardware, software, or firmware communicatively coupled to one or more processors in order to carry out the operations described herein. Circuits may be hardware circuits, and as such circuits may be considered tangible entities capable of performing specified operations and may be configured or arranged in a certain manner. In an example, circuits may be arranged (e.g., internally or with respect to external entities such as other circuits) in a specified manner as a circuit. In an example, the whole or part of one or more computing platforms (e.g., a standalone, client or server computing platform) or one or more hardware processors may be configured by firmware or software (e.g., instructions, an application portion, or an application) as a circuit that operates to perform specified operations. In an example, the software may reside on a machine-readable medium. In an example, the software, when executed by the underlying hardware of the circuit, causes the hardware to perform the specified operations. Accordingly, the term hardware circuit is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein.

Considering examples in which circuits are temporarily configured, each of the circuits need not be instantiated at any one moment in time. For example, where the circuits comprise a general-purpose hardware processor configured using software; the general-purpose hardware processor may be configured as respective different circuits at different times. Software may accordingly configure a hardware processor, for example, to constitute a particular circuit at one instance of time and to constitute a different circuit at a different instance of time.

The above detailed description includes references to the accompanying drawings, which form a part of the detailed description. The drawings show, by way of illustration, specific examples that may be practiced. These examples are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other examples may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as examples may feature a subset of said features. Further, examples may include fewer features than those disclosed in a particular example. Thus, the following claims are hereby incorporated into the Detailed Description, with a claim standing on its own as a separate example. The scope of the examples disclosed herein is to be determined with reference to the appended claims, along with the full scope of equivalents to which such claims are entitled.

What is claimed is:

1. A system comprising at least one processor and a memory in communication with the at least one processor, wherein the system is programmed to:
   receive from a lead generator component first execution cycle data comprising a first set of leads and a second set of leads, wherein the first set of leads comprises first lead information describing a plurality of first potential customers and the second set of leads comprises second lead information describing a plurality of second potential customers;

determine by a lead scorer component a first lead score for the plurality of first potential customers in the first set of leads based at least in part on a first lead scoring model;
determine that the first lead score for the first lead is greater than a first lead score threshold for the plurality of first potential customers in the first set of leads;
determine by the lead scorer component that a second lead score for the plurality of second potential customers in the second set of leads is less than the first lead score threshold;
filter a set of filtered leads including the first lead information from the plurality of first potential customers in the first set of leads;
determine by an evaluator component that a quality of the first execution cycle data is different than a quality of analysis window data by more than a quality threshold, the analysis window data comprising a plurality of leads received during an analysis window time period;
determine a second lead scoring model based at least in part on the first execution cycle data;
receive second execution cycle data comprising a third set of leads comprising third lead information describing a plurality of third potential customers;
determine by the lead scorer component a third lead score for the plurality of third potential customers in the third set of leads based at least in part on the second lead scoring model wherein the lead scorer component determines whether a guard-rail enforcer component controls the determined second lead scoring model;
determine that the third lead score for the plurality of third potential customers in the set of third leads is greater than the first lead score threshold;
filter a second set of filtered leads including the third lead information from the third lead; and
adjust at least one of the scoring models on the lead scorer component based on the quality of leads determined by the plurality of lead scoring models;
wherein the determining that the quality of the first execution cycle data is different than a quality of analysis window data by more than a quality threshold comprises:
determining a scrub rate, wherein the scrub rate describes a portion of the first execution cycle data having lead scores greater than the first lead score threshold;
determine that the scrub rate is greater than an analysis window scrub rate by more than a scrub rate threshold; and
wherein the system is further programmed to receive lead score data describing lead scores for at least one lead received during an observation period and at least one lead received during the analysis window and not during the observation period.

2. The system of claim 1, wherein the determining the second lead scoring model comprises re-training the first lead score model based at least in part on the first execution cycle data.

3. The system of claim 1, wherein the determining the second lead scoring model comprises modifying a scoring parameter of the first lead score model.

4. The system of claim 1, further programmed to after determining the second lead scoring model, determine that application of the second lead scoring model is permitted by a limitation rule.

5. The system of claim 1, further programmed to:
determine an average scrub rate for a second plurality of leads received during the analysis window; and
determine the scrub rate threshold based at least in part on the average scrub rate.

6. The system of claim 1, further programmed to:
determine a mean scrub rate of a plurality of historical scrub rates to generate the analysis window scrub rate; and
determine that the scrub rate threshold is more than two standard deviations higher than the mean scrub rate.

7. The system of claim 1, wherein determining that the quality of the first execution cycle data is different than a quality of analysis window data by more than a quality threshold comprises determining that a first value of the first lead information indicates that the first lead is not likely to convert.

8. The system of claim 1, where the system is further programmed to: before generating the second set of filtered leads, send a message to an administrative user; and
determine that more than a threshold time has passed since the sending of the message.

9. The system of claim 1, wherein the first execution cycle data consists of leads received during an observation period shorter than the analysis window.

10. The system of claim 1, wherein the system is further programmed to determine a scrub rate for a plurality of lead scores for leads received during the analysis window.

11. The system of claim 1, wherein the first execution cycle data and the second execution cycle data consist of leads with a first common value for a first lead category, and wherein the first execution cycle data and the second execution cycle data consist of leads with a second common value for a second common lead value.

12. A method for adaptively generating leads, comprising:
receiving first execution cycle data comprising a first set of leads and a second set of leads, wherein the first set of leads comprises first lead information describing a first plurality of potential customers and the second set of leads comprises second lead information describing a second plurality of potential customers;
determining a first lead score for each of the first plurality of potential customers in the first set of leads based at least in part on a first lead scoring model;
determining that the first lead scores for the first set of leads is greater than a first lead score threshold;
determining that a second lead score for the second set of leads is less than the first lead score threshold;
filtering a set of filtered leads including the first lead information from the first set of leads;
determining that a quality of the first execution cycle data is different than a quality of analysis window data by more than a quality threshold, the analysis window data comprising a plurality of leads received during an analysis window time period;
determining a second lead scoring model based at least in part on the first execution cycle data;
receiving second execution cycle data comprising a third set of leads comprising third lead information describing a plurality of third potential customers;
determining a third lead score for each of the plurality of third potential customers in the third set of leads based at least in part on the second lead scoring model including determining whether a guard-rail enforcer component controls the determined second lead scoring model;
determining that the third lead score for the third lead is greater than the first lead score threshold;
selecting a second set of filtered leads including the third lead information from the plurality of third leads; and adjust at least one of the scoring models on the lead scorer component based on the quality of leads determined by the plurality of lead scoring models;
wherein the determining that the quality of the first execution cycle data is different than a quality of analysis window data by more than a quality threshold comprises:
determining a scrub rate, wherein the scrub rate describes a portion of the first execution cycle data having lead scores greater than the first lead score threshold;
determine that the scrub rate is greater than an analysis window scrub rate by more than a scrub rate threshold; and
receiving lead score data describing lead scores for at least one lead received during an observation period and at least one lead received during the analysis window and not during the observation period.

13. The method of claim 12, wherein the determining the second lead scoring model comprises re-training the first lead score model based at least in part on the first execution cycle data.

14. The method of claim 12, wherein the determining the second lead scoring model comprises modifying a scoring parameter of the first lead score model.

15. The method of claim 12, further comprising, after determining the second lead scoring model, determining that application of the second lead scoring model is permitted by a limitation rule.

16. The method of claim 12, further comprising:
determining an average scrub rate for a second plurality of leads received during the analysis window; and
determining the scrub rate threshold based at least in part on the average scrub rate.

17. The method of claim 12, further comprising:
determining a mean scrub rate of a plurality of historical scrub rates to generate the analysis window scrub rate; and
determining that the scrub rate threshold is more than two standard deviations higher than the mean scrub rate.

18. A non-transitory machine-readable medium comprising instructions which, when read by a machine, cause the machine to perform operations comprising:
receiving first execution cycle data comprising a first set of leads and a second set of leads, wherein the first set of leads comprises first lead information describing a first plurality of potential customers and the second set of leads comprises second lead information describing a second plurality of potential customers;
determining a first lead score for each of the plurality of potential customers in the set of first leads based at least in part on a first lead scoring model;
determining that the first lead scores for the plurality of potential customers in the set of first leads is greater than a first lead score threshold;
determining that a second lead score for the plurality of potential customers in the set of second leads is less than the first lead score threshold;
selecting a set of filtered leads including the first lead information from the first set of leads;
determining that a quality of the first execution cycle data is different than a quality of analysis window data by more than a quality threshold, the analysis window data comprising a plurality of leads received during an analysis window time period;
determining a second lead scoring model based at least in part on the first execution cycle data;
receiving second execution cycle data comprising a third set of leads comprising third lead information describing a plurality of third potential customers;
determining a third lead score for each of the potential customer in the third set of leads based at least in part on the second lead scoring model including determining whether a guard-rail enforcer component controls the determined second lead scoring model;
determining that the third lead scores for the third leads are greater than the first lead score threshold;
selecting a second set of filtered leads including the third lead information from the third set of leads; and
adjust at least one of the scoring models on the lead scorer component based on the quality of leads determined by the plurality of lead scoring models;
wherein the determining that the quality of the first execution cycle data is different than a quality of analysis window data by more than a quality threshold comprises:
determining a scrub rate, wherein the scrub rate describes a portion of the first execution cycle data having lead scores greater than the first lead score threshold;
determine that the scrub rate is greater than an analysis window scrub rate by more than a scrub rate threshold; and
receiving lead score data describing lead scores for at least one lead received during an observation period and at least one lead received during the analysis window and not during the observation period.

* * * * *

UNITED STATES PATENT AND TRADEMARK OFFICE
CERTIFICATE OF CORRECTION

PATENT NO. : 11,354,700 B2
APPLICATION NO. : 16/453471
DATED : June 7, 2022
INVENTOR(S) : Korada et al.

It is certified that error appears in the above-identified patent and that said Letters Patent is hereby corrected as shown below:

On the Title Page

On page 2, in Column 2, under "Other Publications", Line 18, delete "Adapative" and insert --Adaptive-- therefor In the Specification In Column 5, Line 51, delete "model," and insert --model.-- therefor In Column 14, Line 24, delete "706A" and insert --706-- therefor In Column 18, Line 20, delete "of"at" and insert --of "at-- therefor Signed and Sealed this
Thirty-first Day of January, 2023

Katherine Kelly Vidal
*Director of the United States Patent and Trademark Office*